US008746976B2

(12) United States Patent
Kennedy et al.

(10) Patent No.: US 8,746,976 B2
(45) Date of Patent: Jun. 10, 2014

(54) SLIDING ELEMENT WITH DLC COATING

(75) Inventors: Marcus Kennedy, Dusseldorf (DE); Michael Zinnabold, Burscheid (DE)

(73) Assignee: Federal-Mogul Burscheid GmbH, Burscheid (DE)

( * ) Notice: Subject to any disclaimer, the term of this patent is extended or adjusted under 35 U.S.C. 154(b) by 57 days.

(21) Appl. No.: 13/540,884

(22) Filed: Jul. 3, 2012

(65) Prior Publication Data

US 2013/0084031 A1      Apr. 4, 2013

(30) Foreign Application Priority Data

Sep. 29, 2011   (DE) .......................... 10 2011 083 714

(51) Int. Cl.
*F16C 33/00*      (2006.01)

(52) U.S. Cl.
USPC ......................................................... 384/42

(58) Field of Classification Search
USPC .............. 384/276, 279, 297, 902, 907, 907.1, 384/912, 913; 427/249.7, 427; 428/217, 428/323, 325, 408, 457, 701, 702; 204/192.1–192.38
See application file for complete search history.

(56) References Cited

U.S. PATENT DOCUMENTS

| 5,108,813 A | 4/1992 | Noda et al. |
| 6,652,969 B1 * | 11/2003 | Murakami et al. ............ 428/408 |
| 2008/0292812 A1 * | 11/2008 | Ramm et al. .................. 427/570 |
| 2011/0052934 A1 * | 3/2011 | Sugimoto et al. ............. 428/623 |
| 2011/0203468 A1 | 8/2011 | Harada et al. |

FOREIGN PATENT DOCUMENTS

| CN | 101665941 | 3/2010 |
| CN | 101921983 | 12/2010 |
| DE | 19850346 C2 | 6/2003 |
| EP | 1783349 | 5/2007 |
| JP | 2004339564 | 12/2004 |
| JP | 2006002221 A * | 1/2006 |
| JP | 2007177313 | 7/2007 |
| JP | 2008001955 | 1/2008 |
| WO | 0026433 A2 | 5/2000 |
| WO | PCT/EP2009/005284 | 7/2009 |
| WO | 2010009862 A1 | 1/2010 |

OTHER PUBLICATIONS

European search report for EP 12 17 3141 mailed on Dec. 14, 2012.

* cited by examiner

*Primary Examiner* — Phillip A Johnson
(74) *Attorney, Agent, or Firm* — Robert L. Stearns; Dickinson Wright, PLLC

(57) ABSTRACT

A sliding element, and in particular a piston ring, is provided with a DLC coating on a substrate of the sliding element. A material softer than DLC is embedded into the surface of the DLC coating with which the sliding element will come into contact with a sliding partner, against which the sliding element will slide.

17 Claims, 2 Drawing Sheets

14  12

SLIDING ELEMENT WITH DLC COATING

RELATED APPLICATIONS

This application claims priority to German Patent Application No. 10 2011 083714.0, filed Sep. 29, 2011, and is incorporated herein by reference.

TECHNICAL FIELD

The present invention relates to a sliding element, in particular a piston ring, with a DLC coating on a substrate.

RELATED ART

Basically, the piston rings used in highly stressed engines have to have running surface coatings that are as wear-resistant as possible, which is why PVD coatings based on hard materials and DLC coatings are often used. Although PVD coatings are relatively resistant to wear phenomena, they do not, however, provide the necessary low coefficients of friction that would lead to currently desired minimal frictional losses in the engine and thus to currently desired minimal fuel consumption. For this reason the use of a DLC coating is often preferred.

DLC is an abbreviation of "Diamond-Like-Carbon" and denotes an amorphous, diamond-like carbon, which is characterised by particular properties such as good resistance to abrasive and adhesive wear, protection against surface spallation, chemical stability, and good thermal conductivity and mechanical properties (hardness and modulus of elasticity). High hardnesses are obtained in particular for DLC layer systems with a large proportion of $sp^3$-hybridised carbon atoms, the mol fraction of which is more than 60 percent. This substance is also termed tetrahedrically-bonded amorphous carbon (ta-C). In addition, however, DLC layers are also used that have a lower proportion of $sp^3$-hybridised carbon atoms and are less hard than the ta-C layer systems, for example hydrogen-containing and/or metal-containing DLC systems.

A disadvantage of known DLC coatings with high hardnesses for piston rings is that their elasticity and plasticity and therefore their ability to absorb shear forces is very low compared to relatively soft layers. This means that, especially in the so-called running-in period of an engine, even very small unevennesses on the surface of the sliding element or of the running partner can lead to a spallation of the coating surface and thus to a breakdown of the DLC coating even at low surface pressures.

A soft DLC layer has on the other hand the disadvantage of too low a wear resistance, so that already after a relatively short service life the DLC layer is worn and the low coefficient of friction thereby produced can no longer be maintained.

SUMMARY OF THE INVENTION

The object of the present invention is therefore to provide a sliding element with a DLC coating on a substrate that has a low coefficient of friction as well as a high wear resistance and as a result can also tolerate small unevennesses on the surface of a running partner without thereby being significantly damaged.

According to the invention a sliding element, in particular a piston ring, with a DLC coating on a substrate is characterised in that a softer material than DLC is embedded in the surface of the DLC coating with which the sliding contact is to come into contact with a sliding partner. The sliding partner is in this connection an element against which the sliding element will slide, for example in the case of a piston ring a cylinder wall belonging to the relevant piston.

Owing to the embedding of a softer material into the surface of the DLC coating, in particular the critical running-in process of a piston ring to form a so-called third body can be accomplished without any damage. A so-called third body is understood to be a layer in the DLC coating that is formed during the running-in of a piston ring against a cylinder wall. Properties of the third body can be obtained in particular from WO 2010/009 862 A1. The effect of the formation of a third body is also obtained in sliding elements other than piston rings.

In a preferred embodiment the softer material comprises a metal or metal oxide, in particular iron or an iron-chromium compound or oxides thereof, which are softer than the DLC coating. This embodiment is preferred in particular if the cylinder working surface, in other words the sliding partner of the sliding element, has a coating of a corresponding metal or metal oxide. In the internal combustion engine sector iron-based, thermally coated bores are increasingly used as sliding partners of the piston rings, which comprise iron-carbon alloys or iron-chromium alloys or the like. Metal oxides can also be incorporated into the coating by the thermal spraying process with suitably adjusted parameters, in order to improve the wear behaviour. A formation of the sliding element in the sense of this preferred embodiment then means that a material transfer between the DLC coating of the sliding element and the sliding partner occurring during the running-in process is already anticipated, and the running-in process can therefore be carried out without any damage or danger.

Advantageously the DLC coating comprises tetrahedrically-bonded amorphous carbon (ta-C), since this is characterised by a particularly high hardness and therefore wear resistance.

In a further preferred embodiment the surface of the DLC coating contains the softer material in an amount of 50 to 60%, preferably 20 to 40%, of its area. This area-related concentration of the softer material, in particular therefore of the metal or metal oxide, produces the best possible wear and friction values. In investigations conducted outside and inside the engine it was found that too high a proportion of the softer material increases the risk of microweldings and therefore scoring, as well as the danger of breakdown of the DLC coating due to too rapid a wear of the softer material, which can lead to an increased wear and even spallation of the layer. Too low a concentration of the softer material in the surface of the DLC coating means on the other hand that the desired effect of raising the elasticity and plasticity of the DLC coating and thus increasing the ability to absorb shear forces is insufficient, since an optimal running in to ensure the service life of the coating is then no longer guaranteed. The aforementioned area-related proportion has proved particularly advantageous in both respects.

The region of the DLC coating in which the softer material is embedded preferably extends from the surface down to a depth of 1 µm, preferably down to a depth of 0.5 µm, in the DLC coating. This embedding depth of the softer material in the DLC coating leads to an optimal running-in behaviour of a DLC-coated piston ring, since the low wear rate as well as the low coefficient of friction of the DLC coating can thereby be maintained to the maximum extent.

In addition, the surface preferably has as low a roughness as possible, which can be defined by an averaged roughness depth $R_z$ of less than 2 µm, preferably of less than 1 µm, and/or a reduced peak height $R_{PK}$ of less than 0.15 µm, preferably less than 0.1 μm. In this way the number of occurring high surface pressure points can be kept as low as possible, which leads to particularly good sliding properties.

In a preferred embodiment the hardness of the DLC coating outside the regions containing the softer material is 10 to 70 GPa, preferably 15 to 50 GPa. This hardness provides for a low wear of the DLC coating and does not oppose the effect of the improvement in elasticity and thus increased tolerance to shear forces caused by surface defects. The DLC coating preferably contains hydrogen and corresponds to the type a-C:H, a-C:H:Me, ta-C:H or a-C:H:X. Here, Me is a metal preferably selected from chromium, tungsten and titanium, and X is a non-metal preferably selected from silicon, oxygen, nitrogen and boron.

Alternatively the DLC coating preferably corresponds to the type ta-C or a-C and does not contain hydrogen.

The two aforementioned preferred variants of the sliding element provide a good hardness and thus wear resistance and at the same time a low coefficient of friction.

In a preferred embodiment the sliding element includes between the substrate and the DLC coating a preferably metal-containing adhesive layer, which in particular has a thickness of 0.1 μm to 1.0 μm. Such an adhesive layer improves the adhesion of the DLC coating to the substrate and thus in addition improves the durability of the sliding element.

The substrate is preferably formed of cast iron or steel, since these materials are particularly suitable for use as a piston ring or comparable sliding element on account of their strength combined with elasticity.

A method according to the invention for producing a sliding element as has been described above is characterised in that a softer material than DLC is incorporated in a surface of a DLC coating of the sliding element that will come in to contact with a sliding partner. The softer material, preferably a metal or metal oxide, in particular iron or an iron-chromium compound or oxides thereof, is therefore incorporated into the DLC coating after this has already been applied to the substrate.

The incorporation of the softer material into the surface of the DLC coating can in this connection preferably be carried out by coating or by working in. Possible working-in methods are mechanical brushing with a steel brush, a steel strip polishing process, or lapping. The coating of the substrate can be carried out for example by spray coating, sputtering or PVD arc processes.

An independent aspect of the present invention is the use of one of the aforementioned methods in order to provide a piston ring with a material that is present in a cylinder wall of an internal combustion engine, against which the piston ring slides when used according to instructions. This use should be distinguished from a method simply involving machining a surface of a DLC coating, since according to the invention the material that is incorporated into the surface of the DLC layer is matched to the future sliding partner of the sliding element, in particular therefore the piston ring.

By means of the invention outlined hereinbefore it is possible to reduce the friction between a piston ring and a cylinder wall, or in general a sliding element and a sliding partner, which is relevant especially in internal combustion engines with a reduced fuel consumption and is therefore greatly desired. At the same time the sliding element according to the invention is wear resistant and tolerant to unevennesses on the surface of a sliding partner, so that for example during the running-in period of an internal combustion engine there is no danger of a spallation of the surface of the piston ring.

Further advantages, features and advantageous modifications of the invention follow from the totality of the claims and the following description of the Figures.

THE DRAWINGS

DETAILED DESCRIPTION

Figure 1:
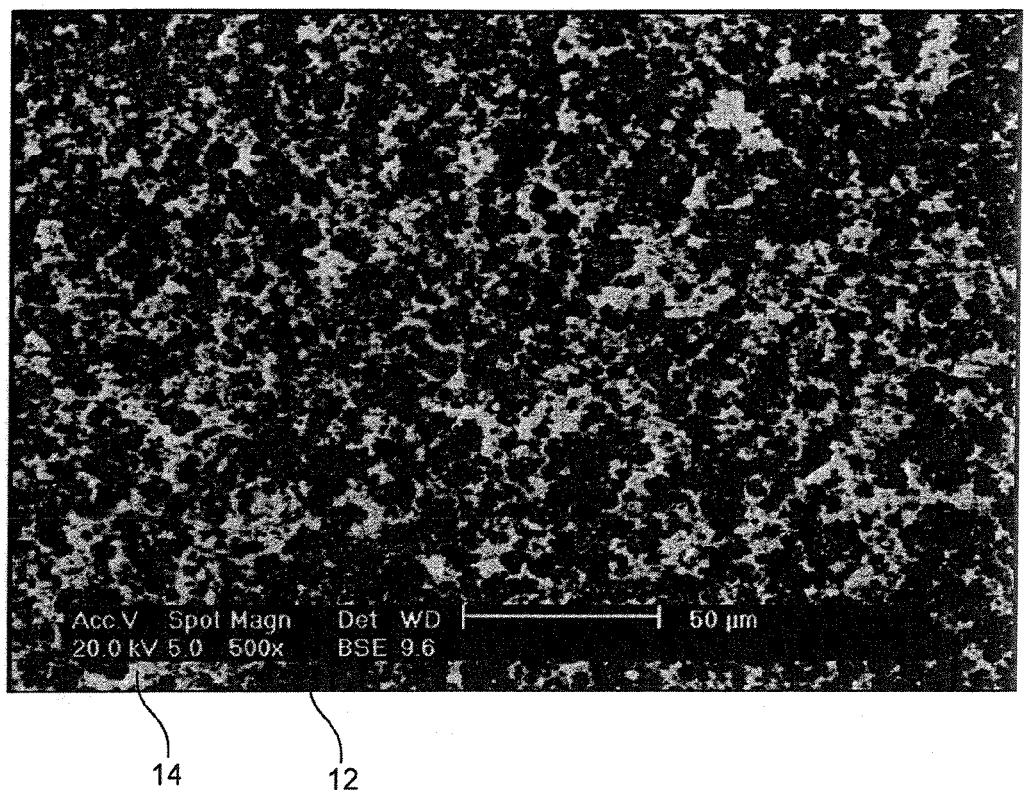
FIG. 1 shows a SEM photograph of a preferred DLC-coated surface.

FIG. 1 shows a SEM image of the surface of a DLC coating 12 with metal/metal oxide incorporations 14 in an initial layer thickness of 12 μm. The area-related proportion of the metal/metal oxide incorporations 14 is in this case 39%. Tests were carried out in which various samples were provided with metal/metal oxide incorporations, whose area-related proportions varied between 27.8% and 39%.

The samples provided with metal/metal oxide incorporations exhibit significantly better properties in friction and wear tests than untreated DLC coatings. This can be seen from FIGS. 3 and 4, which are briefly discussed hereinafter.

Figure 2:
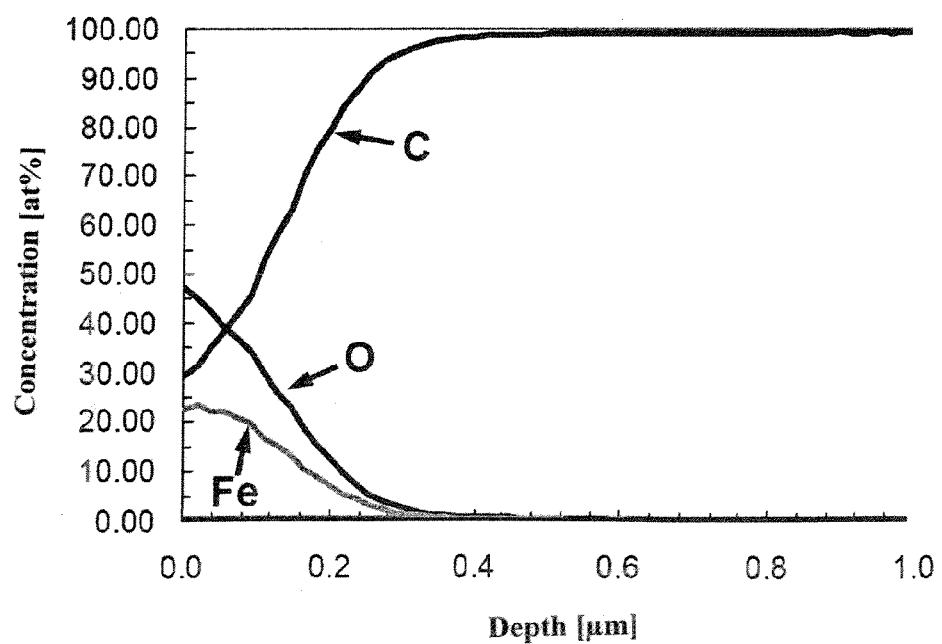
FIG. 2 shows an element depth profile of a DLC coating with incorporated metals and metal oxides.

FIG. 2 shows the depth profiles of the main constituents of a DLC coating, in the surface of which iron and iron oxide were incorporated. The proportion of respectively the three main constituents carbon (C), oxygen (O) and iron (Fe) is plotted along the Y axis, and the layer depth of the surface of the DLC layer down to a depth of 1 μm is plotted along the X axis.

As can be seen from this diagram, the measurable embedded proportions of the iron and iron oxide only extend down to 0.5 μm. Below this depth the DLC coating exhibits no corresponding embedding of iron or iron oxide.

It was established on the basis of engine tests that the embedding of the metal/metal oxide to a depth of 0.5 μm is particularly effective. On the other hand, the metal proportion in the DLC coating could no longer be detected after an engine test over 240 hours with an annular wear of 0.7 to 1.0 μm.

Figure 3:
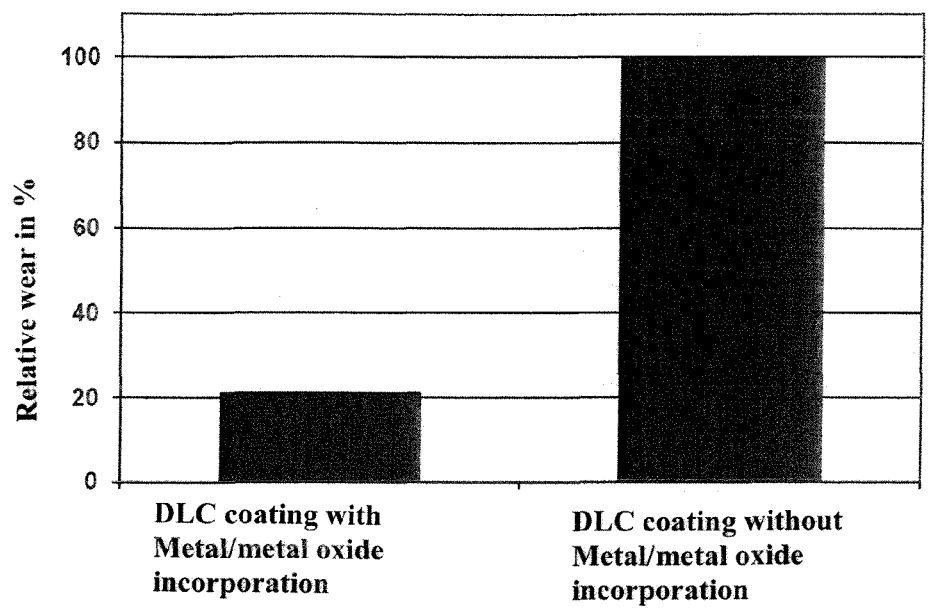
FIG. 3 shows a comparison of the wear values of two DLC coatings.

FIG. 3 shows the relative wear of a DLC coating without metal/metal oxide incorporations and with such incorporations. The DLC coating with incorporations is shown on the left-hand side of the diagram of FIG. 3. The diagram shows that the wear of the DLC coating with metal/metal oxide incorporations is only about 20% of the wear of a DLC coating without incorporations.

The wear was measured in the so-called vibration-friction wear test, in which the sliding element vibrates with a constant load and at a constant rate against a lubricated counter body.

Figure 4:
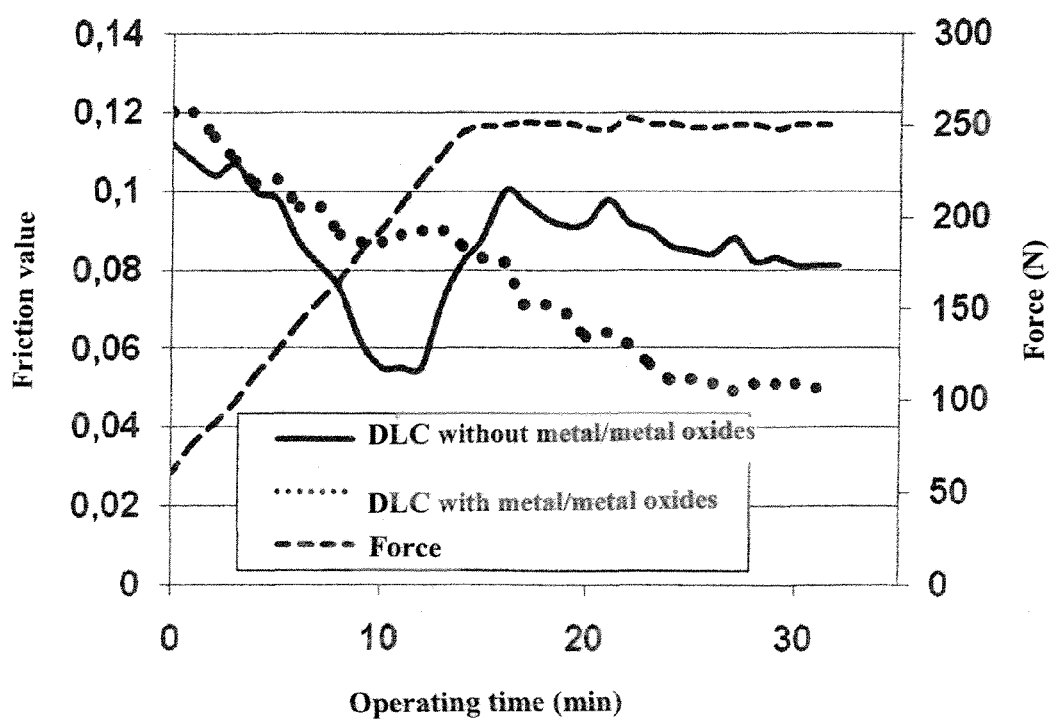
FIG. 4 shows a diagram of a force curve and friction curve of DLC-coated piston rings with and without metal incorporations.

FIG. 4 finally shows a further diagram, in which the force behaviour and friction behaviour of DLC-coated piston rings with and without metal/metal oxide incorporations are plotted against time.

Here the continuous curve shows the frictional behaviour of a DLC coating without metal/metal oxide incorporations, the dotted curve shows the frictional behaviour of a DLC coating with metal/metal oxide incorporations, and the chain-dotted curve shows the force behaviour over time.

From FIG. 4 it can be seen that the DLC coating with metal/metal oxide incorporations exhibits a lower degree of wear than the coating without such incorporations in the surface; since the friction of the DLC coating without incorporations increases after a short running-in phase of 10-12 minutes, whereas the friction of the DLC coating with incorporations falls almost constantly.

The foregoing invention has been described in accordance with the relevant legal standards, thus the description is exemplary rather than limiting in nature. Variations and modifications to the disclosed embodiment may become apparent to those skilled in the art and do come within the scope of the invention. Accordingly, the scope of legal protection afforded this invention can only be determined by studying the following claims.

What is claimed is:

1. A piston ring comprising a DLC coating on a substrate of said piston ring, and including a softer material than DLC that is embedded in the surface of the DLC coating with which said piston ring will come into contact with a corresponding sliding partner, against which said piston ring will slide.

2. The piston ring according to claim 1, wherein said softer material comprises a metal or metal oxide which is softer than the DLC coating.

3. The piston ring according to claim 1, wherein the surface of the DLC coating presents an area and comprises said softer material in an amount of 15-60% of the area.

4. The piston ring of claim 3 wherein the softer material is embedded only in the surface of the DLC coating.

5. The piston ring according to claim 1, wherein the region of the DLC coating in which said softer material is embedded, extends from the surface down to a depth of 1 µm in the DLC coating.

6. The piston ring according to claim 1, wherein the surface has an averaged roughness $R_z$ of less than 2 µm and/or a reduced peak height $R_{pk}$ of less than 0.15 µm.

7. The piston ring according to claim 1, which furthermore includes an adhesive layer of a metal between the substrate and the DLC coating.

8. The piston ring of claim 7, wherein said metal consists of chromium, titanium or tungsten.

9. The piston ring of claim 1, wherein said softer material is selected form materials consisting of: iron, iron-chromium or oxides thereof.

10. The piston ring of claim 1, wherein the surface of the DLC coating presents an area and comprises said softer material in an amount of 20-40% of the area.

11. The piston ring of claim 1, wherein the region of the DLC coating in which said softer material is embedded, extends from the surface down to a depth of 0.5 µm in the DLC coating.

12. The piston ring of claim 1, wherein the surface has an average roughness $R_z$ of less than 1 µm and/or a reduced peak height $R_{pk}$ of less than 0.1 µm.

13. A method for producing a piston ring comprising applying a DLC coating on a substrate of the piston ring and embedding a material that is relatively softer than that of the DLC coating into a surface of the DLC coating of the piston ring that will come into contact with a sliding partner, against which the piston ring will slide.

14. The method according to claim 13, wherein the softer material is selected as a metal or a metal oxide.

15. The method according to claim 14, wherein the softer material is incorporated into the surface of the DLC coating by coating or by working in.

16. The method of claim 14 wherein the metal or metal oxide is selected as iron, iron-chromium or oxides thereof.

17. The method of claim 13 wherein the surface of the DLC coating presents an area, and the embedding step includes embedding the softer material only into the surface of the DLC coating and in an amount of 15-60% of the area.

* * * * *